(12) United States Patent
Chen

(10) Patent No.: US 8,422,220 B2
(45) Date of Patent: Apr. 16, 2013

(54) LATCH MECHANISM FOR PORTABLE ELECTRONIC DEVICE

(75) Inventor: Chao Chen, Waterloo (CA)

(73) Assignee: Research In Motion Limited, Waterloo, Ontario ( * ) Notice: Subject to any disclaimer, the term of this patent is extended or adjusted under 35 U.S.C. 154(b) by 216 days.

(21) Appl. No.: 12/915,135

(22) Filed: Oct. 29, 2010

(65) Prior Publication Data

US 2012/0106035 A1    May 3, 2012

(51) Int. Cl.
*G06F 1/16* (2006.01)
*H05K 5/00* (2006.01)
*H05K 7/00* (2006.01)

(52) U.S. Cl.
USPC .................................................. 361/679.58

(58) Field of Classification Search ............. 361/679.02, 361/679.55, 679.56, 679.58; 174/17 R, 50, 174/520
See application file for complete search history.

(56) References Cited

U.S. PATENT DOCUMENTS

| | | | | |
|---|---|---|---|---|
| 5,383,098 A * | 1/1995 | Ma et al. | ................... | 361/818 |
| 5,682,291 A * | 10/1997 | Jeffries et al. | ............. | 361/679.58 |
| 6,507,377 B1 * | 1/2003 | Jung | ................... | 349/60 |
| 6,616,106 B1 * | 9/2003 | Dean et al. | ................... | 248/27.1 |
| 6,654,078 B1 * | 11/2003 | Kato et al. | ................... | 349/58 |
| 6,894,739 B2 * | 5/2005 | Sung et al. | ................... | 349/58 |
| 7,004,614 B2 * | 2/2006 | Tsai et al. | ................... | 362/633 |
| 7,209,195 B2 * | 4/2007 | Lin | ................... | 349/58 |
| 7,236,357 B2 * | 6/2007 | Chen | ................... | 361/679.55 |
| 7,429,700 B2 * | 9/2008 | Kanamaru et al. | ............. | 174/50 |
| 7,525,795 B2 * | 4/2009 | Cheng | ................... | 361/679.33 |
| 7,570,313 B2 * | 8/2009 | Wu et al. | ................... | 349/58 |
| 7,642,452 B2 * | 1/2010 | Kanazawa et al. | ............. | 174/50 |
| 7,712,621 B2 * | 5/2010 | Cho et al. | ................... | 220/4.28 |
| 7,940,287 B2 * | 5/2011 | Kim et al. | ................... | 349/60 |
| 8,101,859 B2 * | 1/2012 | Zadesky | ................... | 174/50 |
| 2006/0146486 A1 * | 7/2006 | Wikstrom et al. | ............. | 361/681 |
| 2006/0227502 A1 * | 10/2006 | Cheng | ................... | 361/685 |
| 2007/0052100 A1 * | 3/2007 | Bellinger | ................... | 257/758 |
| 2008/0013087 A1 * | 1/2008 | Bailey et al. | ................... | 356/399 |
| 2008/0048958 A1 * | 2/2008 | Kim et al. | ................... | 345/87 |
| 2008/0084994 A1 | 4/2008 | Chuang | | |
| 2008/0158810 A1 * | 7/2008 | Liu et al. | ................... | 361/685 |
| 2008/0247127 A1 * | 10/2008 | Finnegan | ................... | 361/681 |

(Continued)

OTHER PUBLICATIONS

European Search Report from corresponding EP Application dated Apr. 26, 2011.

*Primary Examiner* — Adrian S Wilson

(74) *Attorney, Agent, or Firm* — Gowling Lafleur Henderson LLP

(57) ABSTRACT

A latching assembly comprises a bracket, and a hook. The hook comprises: a top; a base having a first portion proximate to a first end and a second portion proximate to a second end. The second portion is inclined or sloped towards the top. A front surface extends from the first end to the second end. The front surface is substantially parallel to the surface of the second part at the first end, forming a first portion of the base for engaging the bracket. The front surface is further inclined or sloped toward the surface of the second part at the second end. When the bracket and the hook are engaged and the first part and the second part are separated by force, the bracket slides on the second portion of the base and the inclined or sloped front surface at the second end, thereby disengaging the bracket from the hook.

19 Claims, 7 Drawing Sheets

U.S. PATENT DOCUMENTS

| | | | |
|---|---|---|---|
| 2009/0152415 A1* | 6/2009 | Yang et al. | 248/201 |
| 2009/0175020 A1 | 7/2009 | Zadeski | |
| 2010/0053856 A1 | 3/2010 | Lu | |
| 2011/0209376 A1* | 9/2011 | Kinno | 40/790 |

* cited by examiner (F)

(J)

(G)

(K)

(H)

(L)

(A)

(B)

LATCH MECHANISM FOR PORTABLE ELECTRONIC DEVICE

CROSS-REFERENCE TO RELATED APPLICATIONS

This is the first application filed for the present technology.

BACKGROUND

The present patent disclosure relates to a latching assembly, and more specifically, to a latching assembly for a portable electronic device.

The manufacture and design of today's portable electronic devices, for example, mobile phones, smart phones, PDAs, laptop computers, is constantly evolving. Early portable electronic device designs were necessarily large and bulky. Advances in circuitry and storage technology have enabled portable electronic device designers to create smaller and smaller devices. These instruments are not only lighter, but also less cumbersome and easier to transport. Today's portable electronic devices have become more fashionable, at the same time provide an increasing number of functionalities.

The ever decreasing sizes of today's portable electronic devices have the unintended consequence of requiring not only the electronic parts, but also the mechanical parts to shrink in size. One example of such mechanical parts is the latch assembly which can be found in many portable electronic devices.

Referring to FIG. 1, a conventional latch assembly 100 found in the portable electronic devices generally includes a hook 102 and a bracket 104. The hook 102 is generally a continuation of a first part of two parts to be latched, while the bracket 104 is connected to another part. The hook 102 may have a roofed top 106 to facilitate the engagement of the hook 102 with the bracket. Once engaged, the surfaces 108 of the hook 102 and the bracket provide a secure holding. The hook-bracket latch mechanism can only disengage if access is provided to push and bend the hook 102 or the bracket.

However, contemporary design of the portable electronic devices may not provide room for such rework access at the place where the latch mechanism is located. For example, when a keypad is last installed to the body of a mobile communication device, there may be no room for a rework access slot at the front decoration part.

Therefore, there is a need for a latch mechanism which can easily disengage when a peeling force is applied to the two parts of the latch mechanism.

BRIEF DESCRIPTION OF THE DRAWINGS

These and other features of the patent disclosure will become more apparent from the following description in which reference is made to the appended drawings wherein.

DETAILED DESCRIPTION OF PREFERRED EMBODIMENTS

Figure 1:
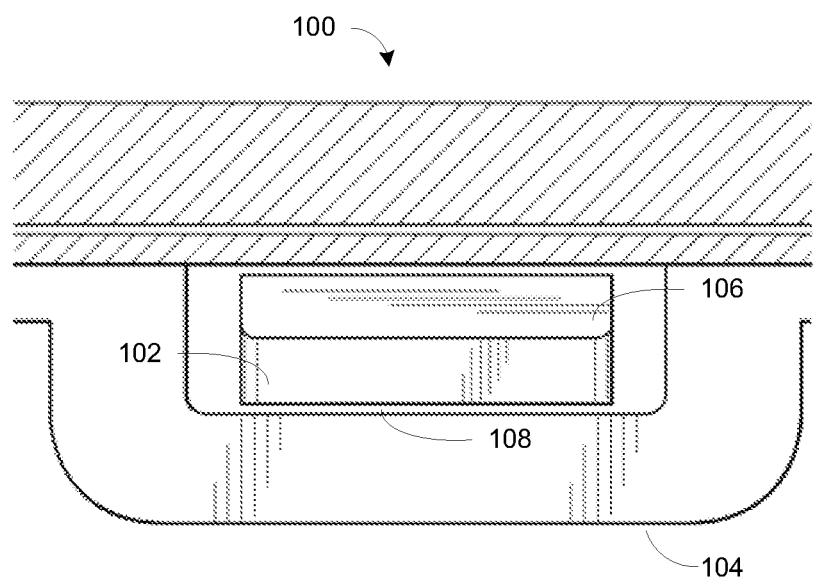
FIG. 1 shows a conventional latch assembly 100 found in the portable electronic devices.

In accordance with one embodiment of the present patent disclosure there is provided a latching assembly for holding two parts of a portable electronic device. The latching assembly comprises: a bracket extending from the first part and a hook extending from a surface of the second part. The hook includes a top; a first end and a second end; a base having a first portion proximate to the first end and a second portion proximate to the second end; a front surface extending from the first end to the second end, the front surface being substantially parallel to the surface of the second part at the first end, forming a first portion of the base for engaging the bracket, the front surface further inclined or sloped towards the surface of the second part at the second end; wherein when the bracket and the hook are engaged and the first part and the second part are separated by force, the bracket slides on the second portion of the base and the inclined or sloped front surface at the second end, thereby disengaging the bracket from the hook.

In accordance with one embodiment of the present patent disclosure there is provided a portable electronic device comprising the latch assembly.

Preferably, the second portion is inclined or sloped towards the top.

Preferably, the bracket is chamfered.

Preferably, the top of the hook is roof shaped.

Preferably, the inclined or sloped front surface at the second end is arcuate sloped in a convex form.

Preferably, the second portion of the base is arcuate sloped in a convex form.

Preferably, the top of the hook is chamfered.

Preferably, the second end of the hook has a shape of a round nub.

Preferably, the bracket has a U shape.

Preferably, at least one of the hook and the bracket is resilient.

Preferably, the first part is an enclosure of a portable electronic device, and the second part is a keyboard, a display or a cover.

Preferably, the second part is an enclosure of a portable electronic device, and the first part is a keyboard, a display or a cover of the portable electronic device.

Reference will now be made in detail to some specific embodiments of the patent disclosure including the best modes contemplated by the inventors for carrying out the patent disclosure. Examples of these specific embodiments are illustrated in the accompanying drawings. While the patent disclosure is described in conjunction with these specific embodiments, it will be understood that it is not intended to limit the patent disclosure to the described embodiments. On the contrary, it is intended to cover alternatives, modifications, and equivalents as may be included within the spirit and scope of the patent disclosure as defined by the appended claims. In the following description, numerous specific details are set forth in order to provide a thorough understanding of the present patent disclosure. The present patent disclosure may be practiced without some or all of these specific details. In other instances, well-known process operations have not been described in detail in order not to unnecessarily obscure the present patent disclosure.

The terminology used herein is for the purpose of describing particular embodiments only and is not intended to be limiting of the patent disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
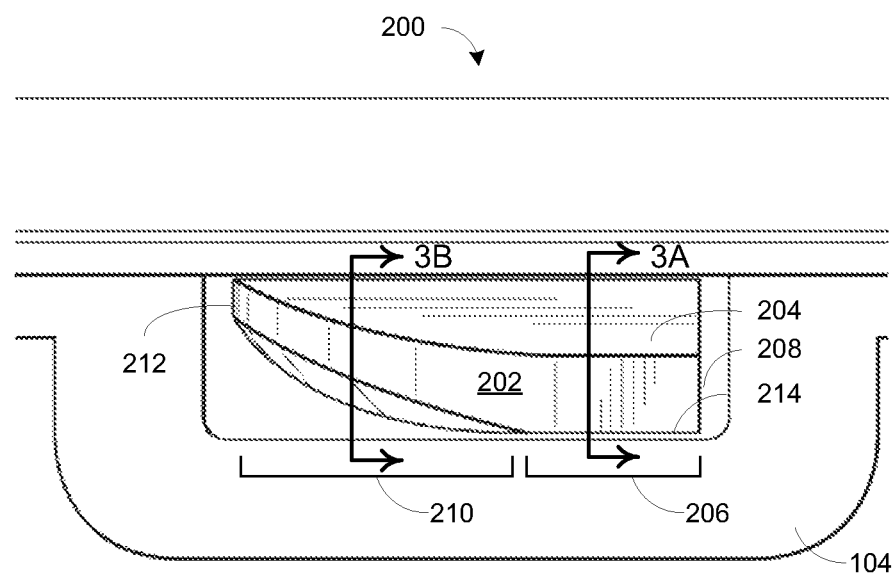
FIG. 2 depicts a latch assembly in accordance with one embodiment of the present patent disclosure.

Referring to FIG. 2, in one embodiment of the present patent disclosure, the hook 202 may, as in traditional design, a roofed or chamfered top 204. The term "roofed top" is intended to describe a top which is inclined towards the edge of the hook 202. The term "chamfered top" is intended to describe a top which is sloped towards the edge of the hook 202, the chamfered top may be sloped in an arcuate fashion. The profile of the arcuate slope may be convex or concave. The hook 202 may be considered to comprise two portions, a first portion 206 proximate to a first end 208, and a second portion 210 proximate to a second end 212. The profile of the first portion 206 is comparable to the conventional hook as illustrated in a sectional view in FIG. 3A. The front surface 302 in the first portion 206 is generally parallel to the back 304 of the hook 202. The base 303 is for engaging the bracket 104 when the hook 202 and the bracket 104 are engaged. As the hook 202 may be in the form of an abutment of the device part, the front surface 302 is generally parallel to the surface 306 of the part of the latch mechanism in a holding state. The first portion 206 generally provides the contacting surface 214 for holding two parts of the portable electronic device.

The second portion 210 has two sloped or inclined surfaces. The term "sloped surface" is intended to describe a surface which has a curved, arcuate profile. The term "inclined surface" is intended to describe a surface which has a straight, non-curved profile.

In one embodiment, the sloped surfaces are arcuate towards the back and the top of the hook 202, so that the second portion 210 of the hook 202 has a partial form of a rounded nub.

Figure 3:
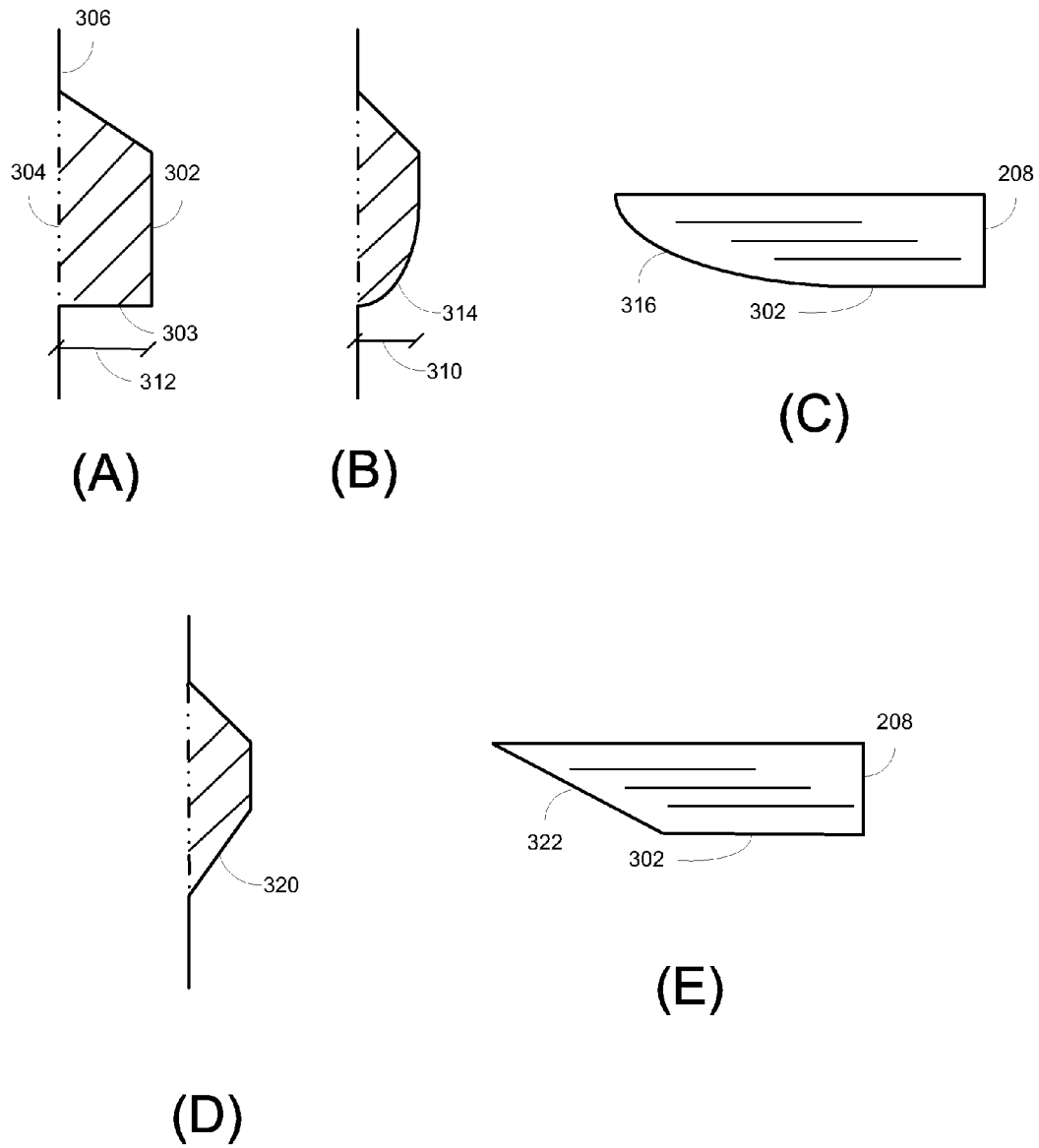
FIG. 3A is a sectional view of the hook at position 3A illustrated in FIG. 2.
FIG. 3B is a sectional view of the hook at position 3B illustrated in FIG. 2.
FIG. 3C is a top view of the hook illustrated in FIG. 2.
FIGS. 3D and 3E show the sectional view and a top view of another embodiment of the present patent disclosure.
FIG. 3F is a top perspective view of a hook in accordance with another embodiment.
FIG. 3G is a bottom perspective view of the hook of FIG. 3F.
FIG. 3H shows the hook of FIG. 3G in engagement with the bracket.
FIG. 3J is a top perspective view of a hook in accordance with yet another embodiment.
FIG. 3K is a bottom perspective view of the hook of FIG. 3J.
FIG. 3L shows the hook of FIG. 3K in engagement with the bracket.
Figure 3:
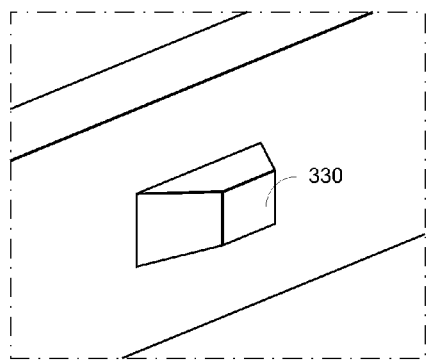
Figure 3:
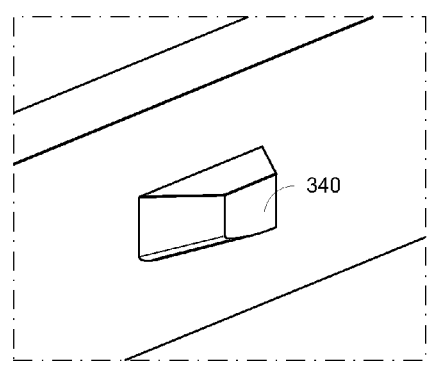
Figure 3:
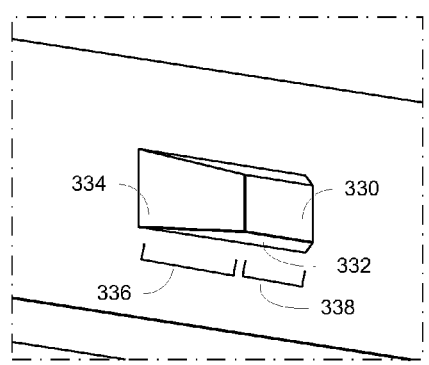
Figure 3:
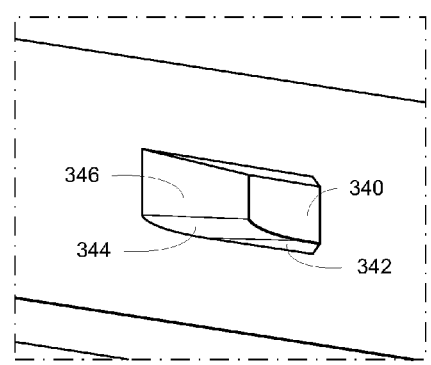
Figure 3:
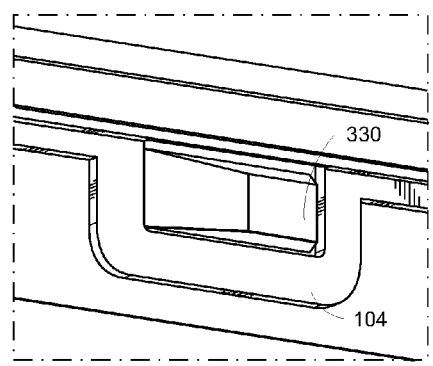
Figure 3:
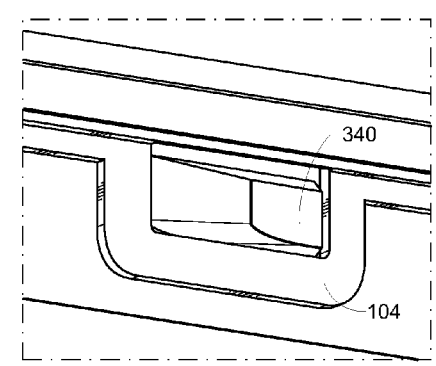

FIG. 3B is a sectional view of the hook at position 3B illustrated in FIG. 2. The hook 202 in this example has a rounded profile at position 3B as the surface 314 of the hook 202 is arcuate towards the back of the hook 202. Accordingly, the depth 310 of the hook 202 is reduced when compared with the depth 312 at position 3A. FIG. 3C is a top view of the hook 202, showing the second arcuate slope 316 toward the back of the hook 202.

As will be readily understood by a person skilled in the art, the second portion 210 of the hook 202 may take other forms, other than the exemplary embodiment of a convex, rounded portion 210 described in FIGS. 2 and 3A-3C. A second non-limiting example is shown in FIGS. 3D-3E.

FIGS. 3D and 3E show the sectional view and a top view of another embodiment whereby the surfaces 320, 322 are inclined towards the back and the bottom of the hook, respectively.

FIGS. 3F to 3H show yet another embodiment of the present patent disclosure. In this embodiment, the hook 330 has a flat bottom 332. FIG. 3F is a top perspective view of the hook 330 while FIG. 3G is a bottom perspective view of the hook 330. FIG. 3H shows the hook 330 in engagement with the bracket 104. In this embodiment, the front surface 334 in the second portion 336 is inclined from the first portion 338 of the hook towards the rear of the hook 330. Therefore, the bottom 332 in the second portion may also contribute to the engagement of the hook 330 to the bracket 104.

FIGS. 3J, 3K and 3L illustrate yet another embodiment of the present patent disclosure. FIG. 3J is a top perspective view of the hook 340 while FIG. 3K is a bottom perspective view of the hook 340. FIG. 3L shows the hook 340 in engagement with the bracket 104. In this embodiment, the bottom 342 of the hook 340 is sloped in an arcuate form 344 while the front surface is inclined 346.

Figure 4:
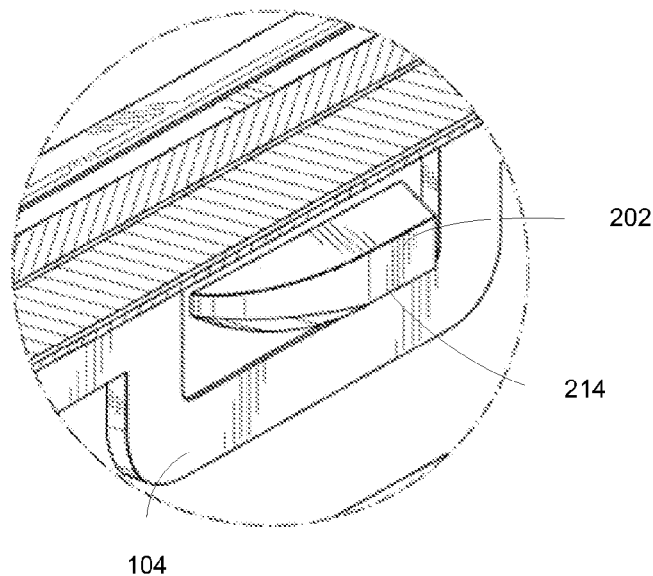
FIG. 4A shows a perspective view of the latch assembly in accordance with one embodiment of the present patent disclosure.
FIG. 4B shows a perspective view of the latch assembly in accordance with another embodiment of the present patent disclosure.
FIG. 4C depicts the latch assembly being disengaged.
Figure 4:
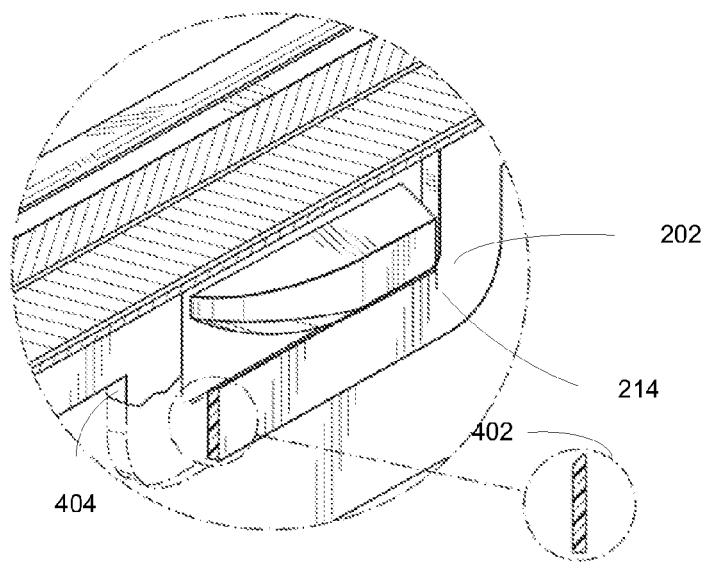
Figure 4:
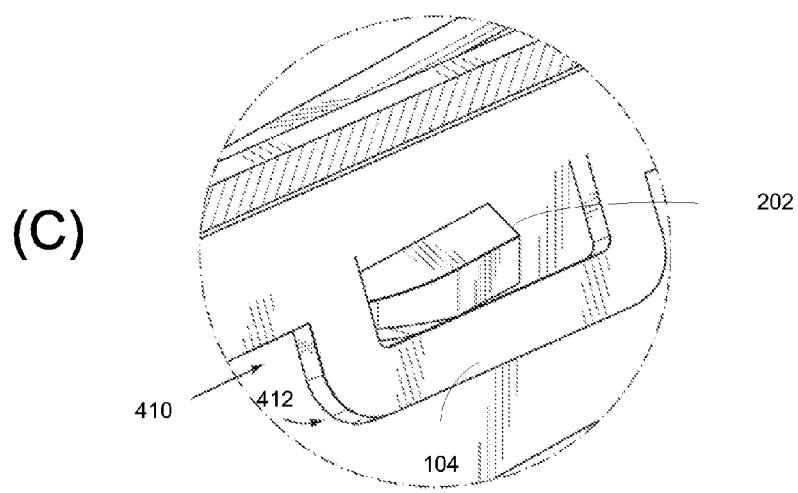

FIG. 4A shows a perspective view of the latch assembly in accordance with one embodiment of the present patent disclosure. The bracket 104 may be extended from a first part of the portable electronic device. The first part may be, for example but not limited to, a case, a base or other form of the enclosure. The hook 202 may be an abutment from a second part of the portable electronic device. The second part may be, for example but not limited to, a keypad, a screen, or a back cover. Furthermore, it should be apparent to a person skilled in the art that the hook may be part of the first part while the bracket may be part of the second part.

As illustrated, the bracket 104 has a U-shaped form. However, it should be understood that other forms of bracket are also possible to hold the hook in place.

In general, at least one of the hook and the bracket is slightly flexible.

The first part and the second part are held together at least by the contacting surface 214 of the latch assembly.

In a preferred embodiment, and referring to FIG. 4B, the bracket 404, at least along the length corresponding to the second portion of the hook, also has a chamfered profile 402 with a shoulder sloped toward the surface facing the hook 202.

Referring to FIGS. 3B, 3C and 4C, when the two parts held together by the latch mechanism is being forced to separate, for example, by a peeling force, the edge of the bracket 104 slides 410, 412 along the sloped surfaces 314, 316 of the hook 202 to gradually disengage the hook 202 from the bracket 104.

Also referring to FIG. 4B, in a preferred embodiment the sliding movement of the bracket 104 is facilitated by the chamfered edge 402 of the bracket 104, the chamfered edge may have a arcuate profile.

Figure 5:
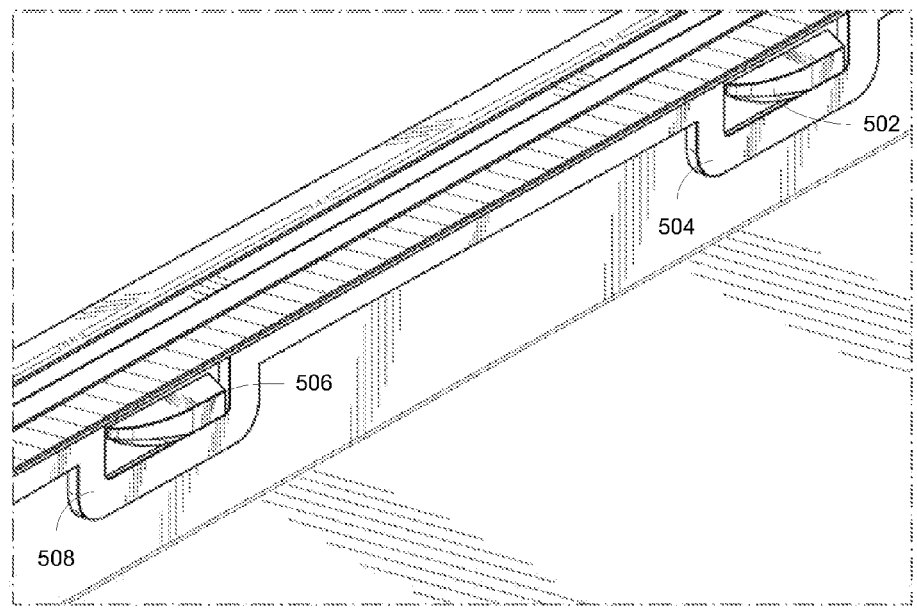
FIG. 5 shows a perspective view of two latch assemblies in accordance with one embodiment of the present patent disclosure.

FIG. 5 shows a perspective view of two latching assemblies in accordance with one embodiment of the present patent disclosure. When a peeling force is applied to separate the two parts of the portable electrical device, the latch assemblies are opened as described in the above successively. When the separating force is applied in the lower left corner, the latch assembly comprising the hook 506 and bracket 508 is first disengaged. After the first latch assembly is disengaged, the next latch assembly with the hook 502 and bracket 504 is then disengaged.

The embodiments of the present patent disclosure provide solutions to place latch assembly at locations where access points to unlatch are not available. Using the embodiments, the access points can be located, for example, in non-decorative areas.

Figure 6:
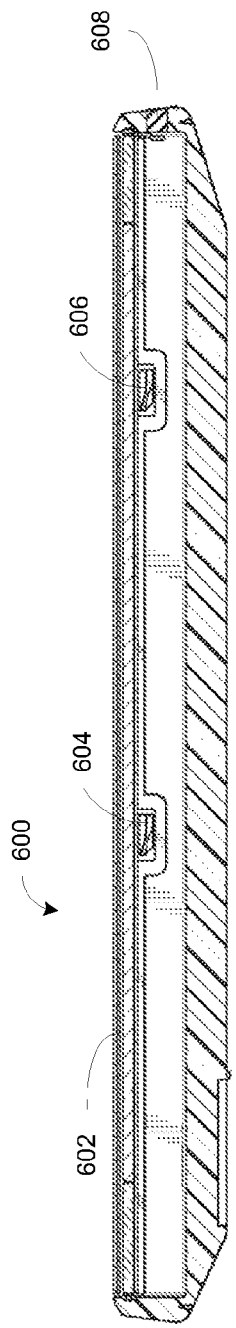
FIGS. 6 and 7 show an embodiment of the latch assembly in accordance with one embodiment of the present patent disclosure in a portable electronic device.
Figure 7:
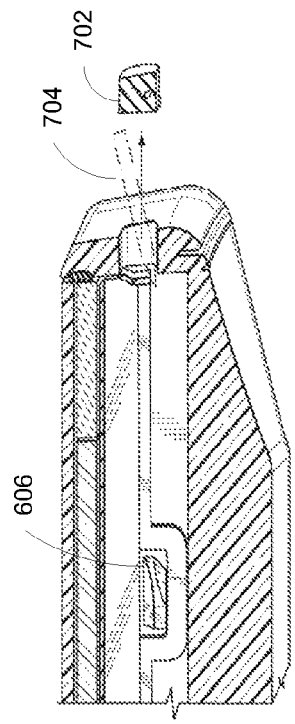

FIGS. 6 and 7 show an embodiment of the latch assembly in accordance with one embodiment of the present patent disclosure in a portable electronic device 600. The portable electronic device 600 has a LCD assembly 602. The portable electronic device 600 does not provide an access point to the latch assemblies 604, 606 on the sides of the device. Therefore, an access point 608 is provided at the bottom of the device. The access point 608 may optionally have a stopper, for example, a rubber stopper.

When the portable electronic device 600 needs to be opened, the stopper 702 is first removed. A tool 704, for example, a flat head screw driver may be used to separate the two parts of the portable electronic device 600. The latch assembly 606 is then opened as described above.

The corresponding structures, materials, acts, and equivalents of all means or step plus function elements in the claims below are intended to include any structure, material, or act for performing the function in combination with other claimed elements as specifically claimed. The description of the present patent disclosure has been presented for purposes of illustration and description, but is not intended to be exhaustive or limited to the patent disclosure in the form disclosed. Many modifications and variations will be apparent to those of ordinary skill in the art without departing from the scope and spirit of the patent disclosure. The embodiment was chosen and described in order to best explain the principles of the patent disclosure and the practical application, and to enable others of ordinary skill in the art to understand the patent disclosure for various embodiments with various modifications as are suited to the particular use contemplated.

It is further understood that the use of relational terms such as first and second, and the like, if any, are used solely to distinguish one from another entity, item, or action without necessarily requiring or implying any actual such relationship or order between such entities, items or actions.

What is claimed is:

1. A latching assembly for holding a first part and a second part comprising:
    a bracket extending from the first part;
    a hook extending from a surface of the second part, the hook comprising:
        a top;
        a first end and a second end;
        a base having a first portion proximate to the first end and a second portion proximate to the second end, the second portion sloped towards the top;
        a front surface extending from the first end to the second end, the front surface being substantially parallel to the surface of the second part at the first end, forming a first portion of the base for engaging the bracket, the front surface further sloped towards the surface of the second part at the second end;
    wherein when the bracket and the hook are engaged and the first part and the second part are separated by force, the bracket slides on the second portion of the base and the sloped front surface at the second end, thereby disengaging the bracket from the hook.

2. The latching assembly according to claim 1, wherein the bracket is chamfered.

3. The latching assembly according to claim 1, wherein the top of the hook is roof shaped.

4. The latching assembly according to claim 1, wherein the sloped front surface at the second end is arcuate sloped in a convex form.

5. The latching assembly according to claim 1, wherein the second portion of the base is arcuate sloped in a convex form.

6. The latching assembly according to claim 1, wherein the top of the hook is chamfered.

7. The latching assembly according to claim 1, wherein the second end of the hook has a shape of a round nub.

8. The latching assembly according to claim 1, wherein the bracket has a U shape.

9. The latching assembly according to claim 1, wherein at least one of the hook and the bracket is resilient.

10. The latching assembly according to claim 1, wherein the first part is an enclosure of a portable electronic device, and the second part is a keyboard, a display or a cover.

11. The latching assembly according to claim 1, wherein the second part is an enclosure of a portable electronic device, and the first part is a keyboard, a display or a cover of the portable electronic device.

12. A portable electronic device comprising a latch assembly according to claim 1.

13. The portable electronic device according to claim 12, further comprising an access point for separating the first part and the second part.

14. The portable electronic device according to claim 13, wherein the access point is remote from the latch assembly.

15. The portable electronic device according to claim 12, wherein the sloped front surface at the second end is arcuate sloped in a convex form.

16. The portable electronic device according to claim 12, wherein the second portion of the base is arcuate sloped in a convex form.

17. The portable electronic device according to claim 12, wherein at least one of the hook and the bracket is slightly flexible.

18. The portable electronic device according to claim 12, wherein the first part is an enclosure, and the second part is a keyboard, a display or a cover.

19. The portable electronic device according to claim 12, wherein the second part is an enclosure, and the first part is a keyboard, a display or a cover of the portable electronic device.

* * * * *